United States Patent [19]

Tehrani et al.

[11] Patent Number: 5,081,511
[45] Date of Patent: Jan. 14, 1992

[54] HETEROJUNCTION FIELD EFFECT TRANSISTOR WITH MONOLAYERS IN CHANNEL REGION

[75] Inventors: Saied N. Tehrani, Scottsdale; Herbert Goronkin, Tempe, both of Ariz.

[73] Assignee: Motorola, Inc., Schaumburg, Ill.

[21] Appl. No.: 578,167

[22] Filed: Sep. 6, 1990

[51] Int. Cl.$^5$ ............ H01L 29/161; H01L 27/12; H01L 29/80

[52] U.S. Cl. .................................. 357/16; 357/4; 357/22

[58] Field of Search .................. 357/16, 22, 23.2, 4

[56] References Cited

U.S. PATENT DOCUMENTS

| 4,807,001 | 2/1989 | Hida | 357/22 |
| 4,882,609 | 11/1989 | Schubert et al. | 357/16 |
| 4,942,438 | 7/1990 | Miyamoto | 357/16 |

OTHER PUBLICATIONS

Extended Abstracts of the 1990 International Conference on Solid State Devices and Materials; Aug. 22, 1990, Part I; pp. 35-38; by Matsumura et al.

Primary Examiner—Mark Prenty
Attorney, Agent, or Firm—Stuart T. Langley

[57] ABSTRACT

A heterojunction field effect transistor (HFET) having a source, drain, and channel, wherein the channel comprises a quantum well and at least one mono-atomic well or barrier layer is provided. The mono-atomic well or barrier layer has a different bandgap than the channel region and serves to modify electron wave function and conduction band energy in the channel region. Preferably, an indium arsenide well monolayer is formed in an InGaAs channel region and functions to move a first quantized energy level $E_0$ closer to the bottom of the channel region quantum well thereby increasing electron concentration by increasing effective band offset potential. Another embodiment uses an aluminum arsenide monolayer as a barrier monolayer in the InGaAs channel. By varying location of the monolayers, confinement of electrons in the channel can be improved.

8 Claims, 4 Drawing Sheets

HETEROJUNCTION FIELD EFFECT TRANSISTOR WITH MONOLAYERS IN CHANNEL REGION

BACKGROUND OF THE INVENTION

The present invention relates, in general, to heterojunction field effect transistors, and more particularly, to heterojunction field effect transistors having controlled energy levels in a quantum well channel.

Field effect transistors operate by controlling current flow through a channel region with a gate electrode. To maintain current control it is necessary to confine charge carriers within the channel region. In metal oxide semiconductor FET (MOSFET) technology current confinement is accomplished by separating the channel region from the gate electrode by an insulating oxide region. In heterojunction FET (HFET) technology, however, the insulating region is not used and carrier confinement is achieved by a heterojunction barrier layer between the gate electrode and the channel region. In other words, the channel is formed by a quantum well using a material with a narrower bandgap than the barrier layer. A similar heterobarrier may be used below the channel region to keep charge carriers from straying into the substrate or buffer layer on which the channel region is formed. In HFET devices, the ability to confine charge carriers within the channel region is of great importance and directly affects device parameters such as pinch-off voltage and gate leakage.

To conduct current through the channel region charge carriers, holes for a P-channel device and electrons for an N-channel device must be provided in the channel region. Higher charge carrier concentration in the channel region results in higher transconductance and lower channel resistance in the HFET device. HFETs are usually modulation doped by placing a thin, heavily doped layer called a carrier supply layer in the barrier layer so that excess charge carriers tunnel from the carrier supply layer through the barrier layer to the quantum well channel region. Here, charge carriers are trapped in the quantum well. Increasing bandgap discontinuity between the carrier supply layer and the smaller bandgap channel layer deepens the quantum well and results in shallower quantized energy levels in the well. The shallow quantized energy levels can hold higher sheet carrier concentration and maintain better carrier confinement in the channel and improve the device characteristics.

In the past HFET devices have been made using gallium arsenide (GaAs) and aluminum gallium arsenide (AlGaAs) materials. GaAs and AlGaAs are closely lattice matched which allows composite devices to be formed. HFETs have been made using a GaAs buffer layer formed on a semi-insulating substrate, with a GaAs channel formed on the buffer layer. $Al_{0.3}Ga_{0.7}As$ has been used for a barrier layer separating the GaAs channel from the gate electrode. This combination of materials results in a bandgap discontinuity of about 0.2 eV. While functioning devices have been formed with these materials, the relatively low bandgap discontinuity did not confine carriers to the channel region very well.

Recently, a great deal of interest has been expressed in the use of strained layer, narrow bandgap indium gallium arsenide (InGaAs) to replace gallium arsenide as a channel material in HFETs. The maximum allowable thickness of the InGaAs strained layer as well as the indium arsenide (InAs) mole fraction depends on the lattice misfit between a GaAs substrate and InGaAs channel layer. Best device results have been obtained within InAs mole fraction of 25% giving a bandgap discontinuity of approximately 0.33 eV for $Al_{0.3}Ga_{0.7}As/In_{0.25}Ga_{0.7}As$ compared to the $Al_{0.3}Ga_{0.7}As/GaAs$ bandgap discontinuity of only 0.2 eV. Because thickness and indium arsenide mole fraction of an InGaAs channel region are limited due to crystallographic concerns, further improvement using these material systems has not been expected.

Accordingly, it is an object of the present invention to provide a heterojunction field effect transistor having improved pinch-off voltage.

Another object of the present invention is to provide an HFET device having reduced gate leakage.

Still another object of the present invention is to provide an HFET structure having mono-atomic barrier and well layers formed in a channel region to modify energy levels within a channel region quantum well.

Still another object of the present invention is to provide an HFET device with improved carrier concentration in the channel region.

A further object of the present invention is to provide an HFET device having improved charge carrier confinement within the channel region.

SUMMARY OF THE INVENTION

These and other objects and advantages of the present invention are achieved by a heterojunction field effect transistor (HFET) having a source, drain, and channel, wherein the channel comprises a quantum well and at least one mono-atomic well or barrier layer. A mono-atomic well layer or barrier layer has a different bandgap than the channel region and serves to modify electron wave function and conduction band energy in the channel region. Preferably, an indium arsenide monolayer is used for a well layer formed in an InGaAs channel region and functions to move a first quantized energy level $E_O$ closer to the bottom of the channel region quantum well thereby increasing electron concentration by increasing effective band offset potential. Aluminum arsenide may also be used in the InGaAs channel as a barrier monolayer. By varying location of the InAs monolayer, confinement of electrons in the channel can be improved.

DETAILED DESCRIPTION OF THE DRAWINGS

Figure 1:
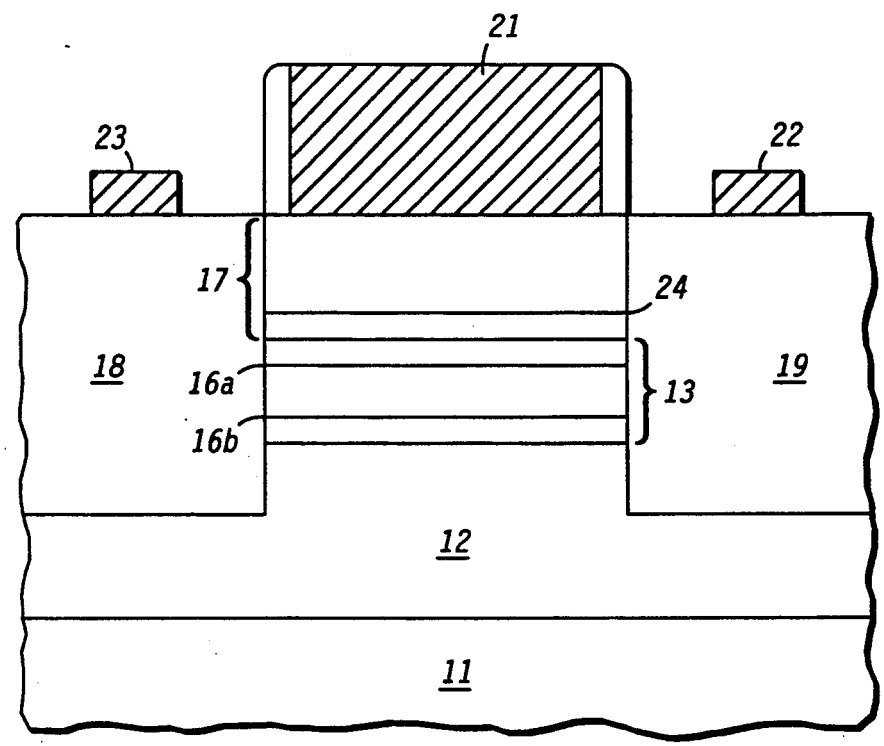
FIG. 1 illustrates a highly simplified cross-sectional view of a heterojunction field effect transistor embodying the present invention.

FIG. 1 illustrates a highly simplified view of a heterojunction field effect transistor (HFET) structure of the present invention. Although illustrative of the modified channel region of the present invention, the device structure shown in FIG. 1 does not include many structures and features which may be present in a practical HFET device. These modifications and additions to the structure shown in FIG. 1 which would yield a practical and manufacturable HFET device are well known in the semiconductor art and are intended to be encompassed within the scope of the present invention.

Although described in terms of an N-channel FET formed using gallium arsenide base compounds, it should be understood that the structure of FIG. 1 could be formed as a P-channel using the method of the present invention and that materials other than gallium arsenide, such as silicon and germanium, could be used to form the heterostructure field effect transistor. Of primary importance when applying the present invention to other material types is maintaining band gap relationships between various layers and regions within the HFET device rather than particular material choice or doping concentrations which may be optimized for a particular application.

As used hereinafter, the term "monolayer" or "monoatomic layer" refers to a layer which is one atom thick. Mono-atomic layers, as well as other layers used in the structure of the present invention, can be formed using conventional epitaxial deposition techniques such as metal oxide chemical vapor deposition (MOCVD), molecular beam epitaxy (MBE) or atomic layer epitaxy (ALE), or the like.

The HFET structure of FIG. 1 is formed on a semi-insulating substrate 11 on which is formed a buffer layer 12. Buffer layer 12 usually comprises a material such as gallium arsenide (GaAs) or indium phosphide (InP). Channel region 13, comprising GaAs or indium gallium arsenide (InGaAs), is formed covering buffer layer 12. Preferably, channel region 13 comprises $In_{0.25}Ga_{0.7}As$. Although GaAs has been used widely in the industry, InGaAs channel regions have been found to provide superior device performance. Channel region 13 is covered by a barrier region 17 comprising aluminum gallium arsenide (AlGaAs), and more specifically, $Al_{0.3}Ga_{0.7}As$. Channel region 13 forms a quantum well between buffer layer 12 and barrier region 17, and therefor may be alternately referred to as quantum well 13. Gate electrode 21 is formed in contact with a top surface of barrier region 17 and forms a Schottky barrier with barrier region 17. It is this Schottky barrier which electrically separates gate electrode 21 from channel region 13.

It should be understood that epitaxial layers which make up channel region 13 and barrier region 17 extend horizontally through regions 18 and 19, although these extensions are not indicated in FIG. 1 to ease understanding of the drawing. Source region 18 and drain region 19 are formed by doping regions on either side of gate electrode 21 heavily N-type for an N-channel HFET using gate electrode 21 as a mask. Regions 18 and 19 must extend at least to channel region 13 so that contact can be made to channel region 13. Source electrode 23 and drain electrode 22 are formed in ohmic contact with regions 18 and 19, respectively. Because of the high doping in source region 18 and drain region 19, electrodes 23 and 22 are ohmically coupled to channel region 13.

Except for regions 18 and 19, channel region 13 is intentionally undoped to improve mobility of charge carriers in the channel. Doping is provided by charge supply layer 24 which is a very thin, heavily doped region of AlGaAs formed during the formation of barrier region 17. Charge supply layer 24, illustrated by a line through barrier region 17, may also comprise indium aluminum arsenide or gallium indium phosphide, either of which will supply excess charge carriers. Charge supply layer 24 is formed close enough to channel region 13 so that excess charge carriers in doping supply layer 24 can tunnel through barrier region 17 and fall into channel region 13. Because channel region 13 is formed of a narrower bandgap material than barrier region 17, charge carriers fall into channel region 13 and are trapped due to the heterojunction barrier formed between channel region 13 and barrier region 17. This technique is known as modulation doping and allows charge carriers to be supplied to channel region 13 without actually doping channel region 13.

Important features of the present invention are monolayer well 16a and monolayer barrier 16b, illustrated by lines extending horizontally through channel region 13. Monolayer 16a comprises a material having a smaller bandgap than channel region 13 such as indium arsenide (InAs) when InGaAs is used for channel region 13. Monolayer 16b comprises a material with a wider bandgap than channel region 13. One example of a material which could be used for monolayer 16b is aluminum arsenide (AlAs) which has a much wider bandgap than InGaAs channel region 13. Monolayers 16a and 16b modify solid state characteristics of channel region 13 thereby affecting device performance, as will be described in more detail hereinafter. Narrow bandgap monolayer 16a may be used alone or in conjunction with one or more wide bandgap monolayers 16b. Further, wide bandgap monolayer 16b may be used alone. Preferably, monolayer 16a is formed near the metallurgic junction between channel region 13 and barrier region 17, while monolayer 16b is formed nearer the metallurgic junction between channel region 13 and buffer layer 12.

Figure 2A:
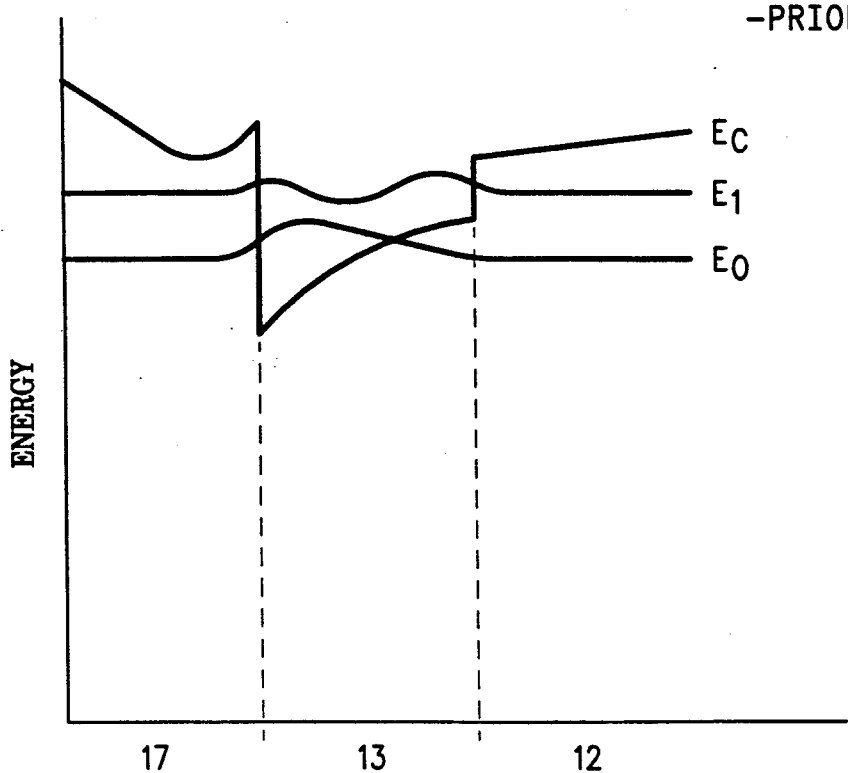
FIGS. 2A and 2B illustrate band diagrams for a prior art HFET structure.

FIG. 2A illustrates a band diagram of a prior art HFET structure which does not use monolayers 16a or 16b. The band diagram in FIG. 2A shows relative energy on a vertical axis and distance from a top surface of the HFET device shown in FIG. 1 on a horizontal axis. Barrier region 17, channel region 13, and buffer layer 12 are illustrated in FIGS. 2A-b, FIGS. 3A-b, and FIG. 4 in the regions denoted by dashed lines and represent regions bearing the same designation in FIG. 1. FIG. 2A shows conduction band $E_c$ and quantum energy states $E_1$ and $E_0$. The band diagram of FIG. 2A illustrates barrier layer 17 with a composition of $Al_{0.3}Ga_{0.7}As$, and channel region 13 with a composition of $In_{0.25}Ga_{0.7}As$. Buffer layer 12 comprises GaAs. Since channel region 13 has a narrower bandgap than either barrier layer 17 or buffer layer 12, channel layer 13 forms a quantum well which, using the materials described hereinbefore, has a bandgap discontinuity in the $E_c$ band of about 0.33 electron volts (eV). Slight modification in relative energies from that shown in FIG. 2A occur when different materials are used.

The significance of quantum energy states $E_1$ and $E_0$ is that electrons must exist in the quantum well at energies $E_1$ or $E_0$ and that so long as $E_1$ and $E_0$ are confined within the quantum well, i.e. have a lower energy than the quantum well barriers, electrons will be confined within the quantum well and therefore confined within channel region 13. To maximize charge carrier concentration in quantum well 13, $E_0$ should lie as near as possible to the bottom of quantum well 13. As set out hereinbefore, it is desirable for device performance that a high concentration of charge carriers are confined within channel region 13. Since $E_1$ lies near the top of the quantum well, it provides an escape path from channel region 13 for charge carriers which gain enough energy to move from $E_0$ to $E_1$. To improve confinement of charge carriers to channel region 13 it is desirable to maximize the separation of $E_0$ and $E_1$.

Figure 2B:
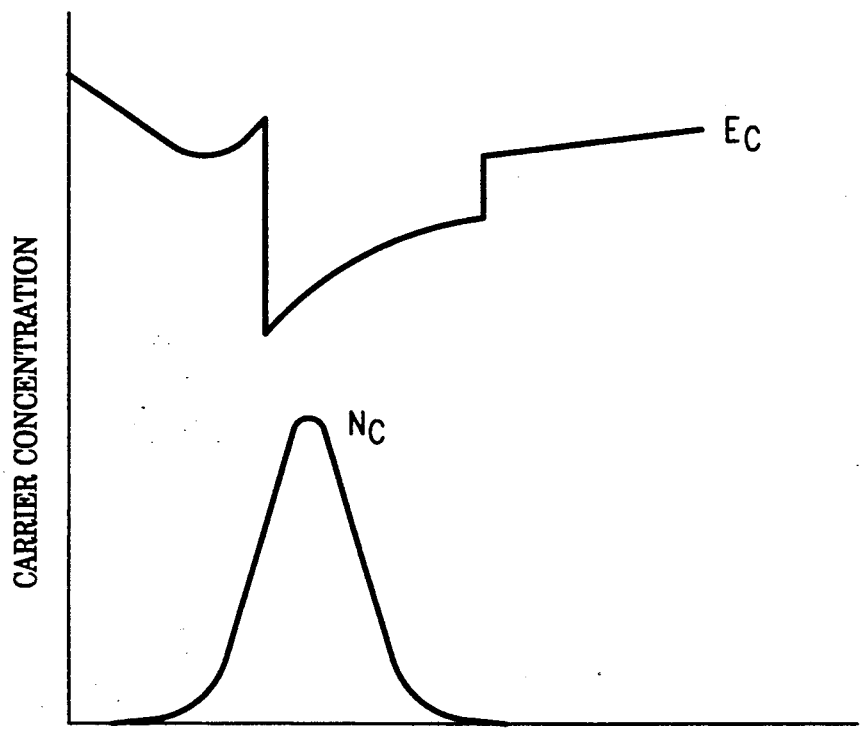

Referring now to FIG. 2B, which is a representation of the prior art structure shown in FIG. 2A showing conduction band $E_c$ with a superimposed curve illustrating relative electron concentration $N_c$ at various locations within the structure. It can be seen that the effect of the quantum well formed by channel region 13 is to provide a relatively high electron concentration within channel region 13. While electron concentration in prior art devices, as shown in FIG. 2B, produce functional HFET structures, higher electron concentration provides superior performance.

Figure 3A:
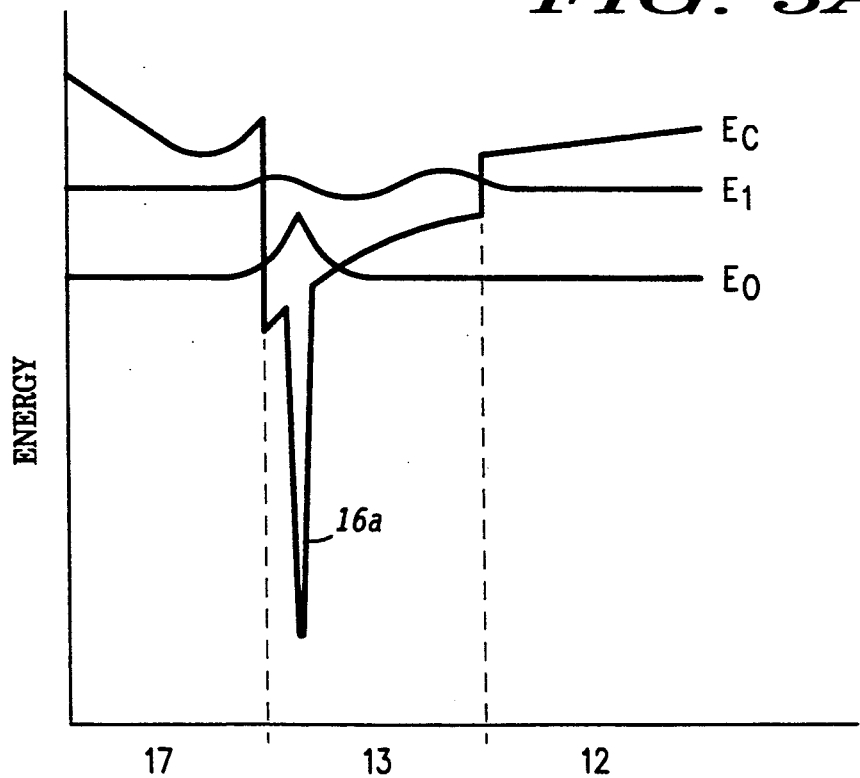
FIGS. 3A and 3B illustrate band diagrams for the HFET structure shown in FIG. 1.
Figure 3B:
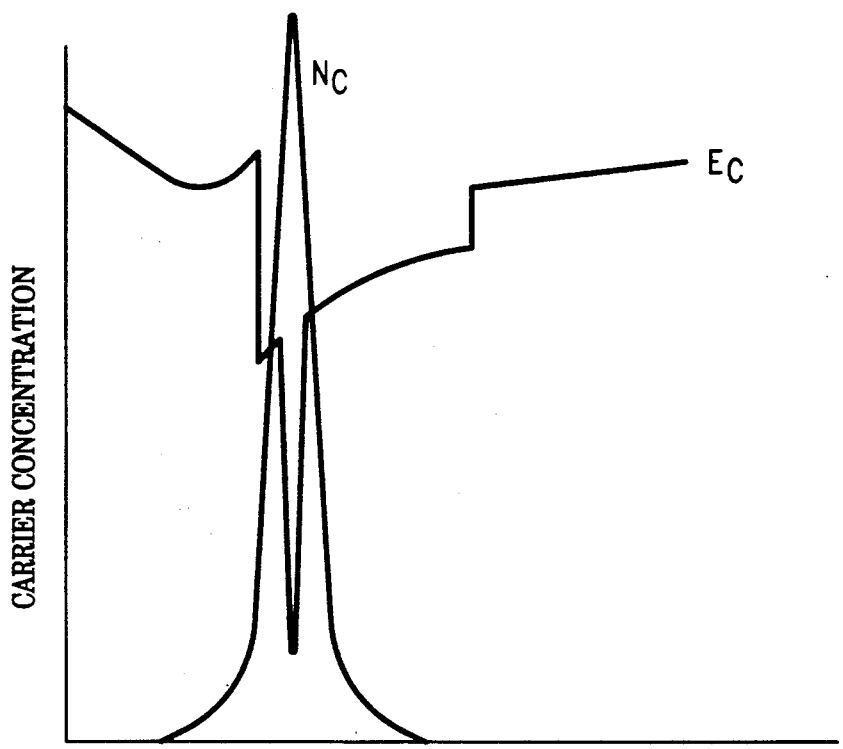

FIG. 3A illustrates a conduction band diagram similar to that shown in FIG. 2A except including the effects of the addition of one monolayer 16a of InAs. The effects of the addition of mono-atomic barrier layer 16a on electron wave function $E_0$ are readily apparent. Wave function $E_0$ falls much lower in energy with respect to the quantum well formed by channel region 13 therefore allowing a much higher electron concentration within channel layer 13, as shown by the $N_c$ curve in FIG. 3B. One InAs monolayer 16a in channel region 13 is believed to more than double the electron concentration within channel 13 as can be seen by comparing FIGS. 3B and 2B.

Figure 4:
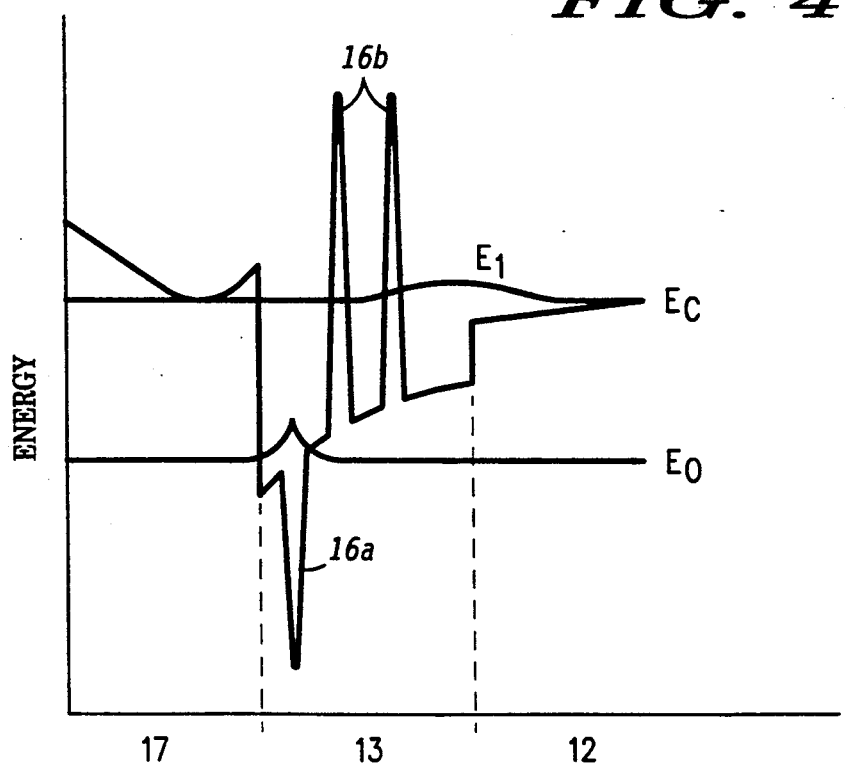
FIG. 4 illustrates a conduction band diagram of a second embodiment of the present invention.

FIG. 4 illustrates a second embodiment of the present invention utilizing one monolayer 16a comprising InAs and two monolayers 16b comprising AlAs. It can be seen that the addition of the two monolayers of AlAs raise the relative energy of electron wave function $E_1$ so that it rises outside of the quantum well formed by channel layer 13. Monolayers 16b, having a larger bandgap than channel layer 13, are used to increase energy and wave function distribution of quantized electron wave function $E_1$. It can be seen in FIG. 4 that a structure having two AlAs barrier monolayers 16b increases the separation between quantized energy levels $E_0$ and $E_1$ in channel region 13 thereby decreasing the probability of scattering of electrons from $E_0$ to $E_1$ and further increasing the confinement of electrons to $E_0$.

In a flat band condition and in a symmetrical quantum well an InAs monolayer 16a placed at a center of the quantum well formed by channel region 13 causes only even numbered energy states (i.e. $E_0$) move to lower levels while odd numbered states (i.e. $E_1$) have a zero wave function at the center of the quantum well and remain fixed in energy. In a non-flat band condition and with an applied bias, even when the quantum well is not symmetrical, a combination of InAs monolayer 16a and an AlAs monolayer 16b can be used to create a condition in which the even quantized energy level ($E_0$) can be adjusted while the odd energy level ($E_1$) has its wave function going to zero at the location of InAs monolayer 16a with the quantized energy level fixed and not affected by the presence of InAs monolayer 16a. In other words, $E_0$ can effectively be lowered independently of $E_1$, thereby achieving desirable separation of $E_0$ and $E_1$ thereby improving carrier confinement in channel region 13.

Large bandgap monolayer 16b could also be used within barrier layer 17, placed a few monolayers away from Schottky barrier gate electrode 21 shown in FIG. 1. When placed in this location, monolayer barrier 16b creates a narrow quantum well underneath the Schottky barrier with quantized energy levels above the bottom of the quantum well. Effective Schottky barrier height is measured from the Fermi level to the quantized energy levels which are higher than the bottom of the well. The larger barrier height improves device performance and reduces gate leakage current and can be utilized for both N or P type devices. Large bandgap monolayers 16b within barrier layer 17 could also reduce the effects of surface states and provide well controlled surface energies that are stable and less affected by surface states and their variation.

Figure 5:
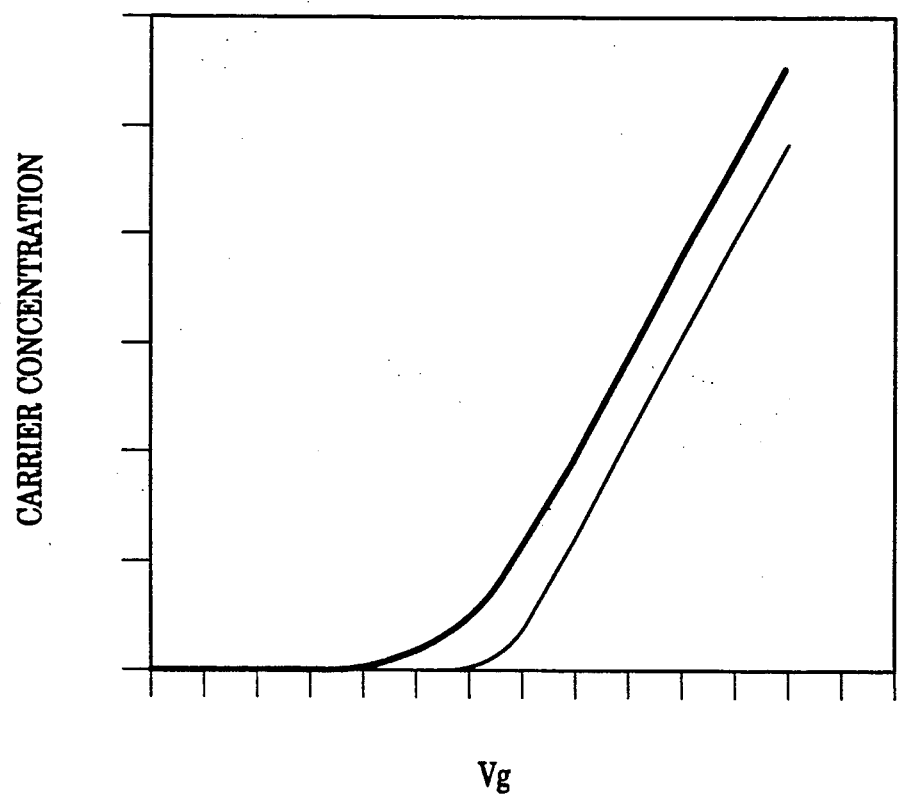
FIG. 5 illustrates a comparison of computer modeled HFET channel characteristics for the prior art device and the device of the present invention.

FIG. 5 illustrates a computer modeled HFET channel region characteristic showing carrier concentration in channel region 13 on the vertical axis and applied gate voltage on the horizontal axis. The bold curve illustrates device performance of the structure shown in FIG. 4, while the plain curve illustrates performance of the prior art structure shown in FIG. 2A. It can be seen that pinch-off voltage is increased using the structure having monolayers 16a and 16b placed in channel region 13. These improvements are the result of increased carrier concentration and improved carrier confinement within channel region 13.

By now it should be appreciated that an improved heterojunction field effect transistor device is provided wherein monolayers of narrower and larger bandgap material are formed within a conventional HFET channel region. The monolayers modify quantum energy levels in the channel region to increase charge carrier concentration and improve charge carrier confinement within the channel region. Improved carrier concentration and confinement results in lower gate leakage, improved speed, reduced channel resistance, and increased pinch-off voltage. The added monolayers are process compatible with conventional HFET structures and can be formed using MOCVD, MBE, or ALE epitaxy techniques which are commonly used to form HFET devices. The HFET structure of the present invention improves device performance while adding little to device or process complexity.

We claim:

1. A heterojunction field effect transistor (HFET) having a source region, a drain region, and a channel region which is coupled to the source and drain regions and is a quantum well, the channel region comprising: a mono-atomic layer formed in the channel region wherein the mono-atomic layer comprises a material with a narrower bandgap than the channel region, and the channel region further comprises a second mono-atomic layer having a wider bandgap than the channel region.

2. The HFET of claim 1 wherein the channel region comprises indium gallium arsenide and the second mono-atomic layer comprises aluminum arsenide.

3. A heterojunction field effect transistor (HFET) comprising: a semi-insulating substrate; a buffer layer covering the substrate and having a bandgap energy; a channel layer covering the buffer layer and having a narrower bandgap than the buffer layer; a semi-insulating barrier layer covering the channel layer wherein the semi-insulating barrier layer has a bandgap which is larger than the channel layer; at least one mono-atomic layer formed in the channel layer, wherein the at least one mono-atomic layer has a bandgap which is different than the channel layer bandgap; a gate electrode coupled to the semi-insulating barrier layer; a source electrode in ohmic contact with the channel layer; and a drain electrode in ohmic contact with the channel layer.

4. A heterojunction field effect transistor (HFET) comprising: a semi-insulating substrate; a buffer layer covering the substrate and having a bandgap energy; a channel layer covering the buffer layer and having a narrower bandgap than the buffer layer; a semi-insulating barrier layer covering the channel layer wherein the semi-insulating barrier layer has a bandgap which is larger than the channel layer; at least two mono-atomic layers formed in the channel layer wherein a first mono-atomic layer has a narrower bandgap than the channel layer and a second mono-atomic layer has a wider bandgap than the channel layer; a gate electrode coupled to the semi-insulating barrier layer; a source electrode in ohmic contact with the channel layer; and a drain electrode in ohmic contact with the channel layer.

5. A heterojunction field effect transistor (HFET) comprising: a semi-insulating substrate; a buffer layer covering the substrate and having a bandgap energy; a channel layer covering the buffer layer and having a narrower bandgap than the buffer layer; a semi-insulating barrier layer covering the channel layer wherein the semi-insulating barrier layer has a bandgap which is larger than the channel layer; at least one mono-atomic layer formed in the channel layer, wherein the at least one mono-atomic layer has a bandgap which is different than the channel layer bandgap; a gate electrode coupled to the semi-insulating barrier layer; a source electrode in ohmic contact with the channel layer; and a drain electrode in ohmic contact with the channel layer, wherein the at least one mono-atomic layer comprises indium arsenide and the channel layer comprises indium gallium arsenide.

6. The HFET of claim 4 wherein the channel layer comprises indium gallium arsenide, the first mono-atomic layer comprises indium arsenide and the second mono-atomic layer comprises aluminum arsenide.

7. The HFET of claim 4 wherein the first mono-atomic layer is formed nearest to the semi-insulating barrier layer and the second mono-atomic layer is formed nearest the buffer layer.

8. A heterojunction field effect transistor (HFET) comprising: a semi-insulating substrate; a buffer layer covering the substrate and having a bandgap energy; a channel layer covering the buffer layer and having a narrower bandgap than the buffer layer; a semi-insulating barrier layer covering the channel layer wherein the semi-insulating barrier layer has a bandgap which is larger than the channel layer; at least one mono-atomic layer formed in the channel layer, wherein the at least one mono-atomic layer has a bandgap which is different than the channel layer bandgap; a gate electrode coupled to the semi-insulating barrier layer; a source electrode in ohmic contact with the channel layer; and a drain electrode in ohmic contact with the channel layer, wherein the buffer layer comprises indium phosphide, the channel layer comprises indium gallium arsenide, the semi-insulating barrier layer further comprises a charge supply layer consisting of a material from the group of indium aluminum arsenide (InAlAs) or gallium indium phosphide (GaInP).

* * * * *